US006850419B2

(12) United States Patent
Chung

(10) Patent No.: US 6,850,419 B2
(45) Date of Patent: Feb. 1, 2005

(54) ANTENNA SWITCH SUPPORT BRACKET

(75) Inventor: Meeok Chung, La Mirada, CA (US)

(73) Assignee: Mitsubishi Digital Electronics America, Inc., Irvine, CA (US)

(*) Notice: Subject to any disclaimer, the term of this patent is extended or adjusted under 35 U.S.C. 154(b) by 0 days.

(21) Appl. No.: 10/412,032

(22) Filed: Apr. 10, 2003

(65) Prior Publication Data

US 2004/0201965 A1 Oct. 14, 2004

(51) Int. Cl.[7] .......................... H05K 5/00; H05K 7/14; H05K 1/11; H05K 9/00

(52) U.S. Cl. ...................... 361/752; 361/800; 361/802; 361/803; 361/816; 361/818

(58) Field of Search ............................ 361/752, 818, 361/796, 302, 800, 816

(56) References Cited

U.S. PATENT DOCUMENTS 3,666,225 A * 5/1972 Weinberger .............. 248/205.3
4,325,103 A * 4/1982 Ito et al. ...................... 361/816
4,790,030 A * 12/1988 Carlson et al. .......... 455/193.1
5,097,389 A * 3/1992 Ito et al. ...................... 361/818
6,118,672 A * 9/2000 Yamauchi et al. .......... 361/818
6,373,111 B1 * 4/2002 Zheng et al. ............... 257/407
6,560,221 B1 * 5/2003 Hara et al. .................. 370/352

* cited by examiner

*Primary Examiner*—Long Pham
*Assistant Examiner*—Shrinivas Rao
(74) *Attorney, Agent, or Firm*—Orrick, Herrington & Sutcliffe LLP

(57) ABSTRACT

An antenna support bracket is provided that preferably strengthens electronic connectors, such as F connectors and the like, by distributing the load or stress applied to an individual connector over all of the connectors in a group of connectors extending from a television or other consumer electronic device, or from an antenna switch mounted therein. In a preferred embodiment, the bracket comprises a thin, elongate body formed of cold rolled steel with a plurality of holes formed therein. The holes, which are spaced apart in a pattern that matches a corresponding group of connectors, are sized to have a diameter slightly largely than the diameters of the connectors to enable the bracket to slide over the connectors.

8 Claims, 2 Drawing Sheets

ANTENNA SWITCH SUPPORT BRACKET

FIELD OF THE INVENTION

The present invention relates generally to antenna switches for television sets and other consumer electronic devices, and more particularly to a bracket that facilitates support of the switch connectors to prevent damage due to lateral stress.

BACKGROUND OF THE INVENTION

Television sets and other consumer electronic devices typically use a plurality of Type "F" connectors to connect antennas, cable broadcast systems, and other inputs such as video cassette recorders (VCRs), digital video devices (DVDs) and the like to the television or device. The F connectors are usually part of a separate switch-like device which commonly referred to as an antenna switch. The antenna switch is mounted within the enclosure of the television or device with the F connectors extending out of the enclosure. Because these connectors are long, typically about 17 millimeters, and narrow, they tend to be quite vulnerable to damage due to lateral stress applied to the connector. Such side stress typically occures when a coaxial cable is screwed onto the F-Connector and the cable is pulled, such as when the television is pulled away from a wall from which the coaxial cable is extending, often breaking the electrical connection between the connector and the television or the main body of the antenna switch.

Therefore, it would be desirable to strengthen these F connectors and reduce their vulnerability to breakage.

SUMMARY OF THE INVENTION

The present invention is directed to an improved method and apparatus for strengthening electronic connectors, such as F connectors and the like, and reducing their vulnerability to breakage. In accordance with the present invention, individual connectors are strengthened or made more durable by distributing the load or stress applied to an individual connector over all of the connectors in a group of connectors such as a group of F connectors extending from a television or an antenna switch. In a preferred embodiment, a load distributing member or bracket of the present invention comprises a body with a plurality of holes formed in and extending through the body. The body is preferrably formed from a thin piece of cold rolled steel having a thickness of about 1.0 millimeters and preferrably in a range of about 0.5 millimeters to 3.0 millimeters. The holes, which are spaced apart in a pattern that matches the group of connectors to be supported or strengthed, are sized to have a diameter slightly largely than the diameters of the connectors to enable the load distributing member or bracket to slide over the connectors.

In operation, the connectors such as F connectors and the like are connected to the internal components of the television or device and mounted such that the connectors extend out of the enclosure of the television or devise. In the case of an antenna switch, the switch is connected to the internal components of the television or device and mounted such that its F connectors extend out of the enclosure of the television or device. The load distributing member or bracket is then slid over the connectors and fixed or held axially in place by a cover plate. When a lateral load is applied to one of the connectors in a group of connectors supported by the bracket, it is distributed to all of the connectors through the bracket which tends to reduce the likelihood that such a load will result in breakage of the connector and/or its electrical connection to the internal components of the television or antenna switch.

Other objects and features of the present invention will become apparent from consideration of the following description taken in conjunction with the accompanying drawings.

DESCRIPTION OF THE DRAWINGS

FIG. 1A is a side view of a typical television set showing an enclosure of the set with F-type connectors extending there from.

DETAILED DESCRIPTION

Figure 1A:
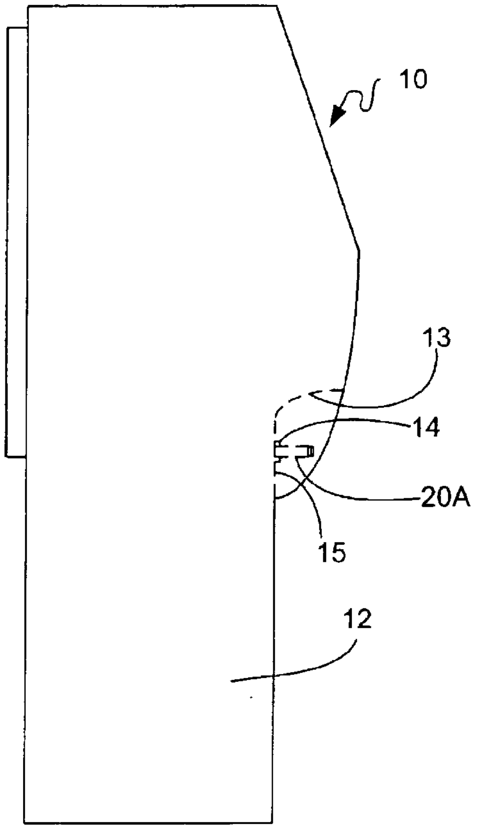
Figure 1B:
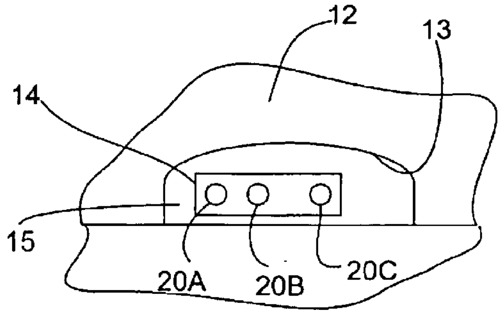
FIG. 1B is a partial rear view of the television set shown in FIG. 1.

Referring in detail to the figures, an improved method and apparatus for strengthening electronic connectors, such as F connectors and the like, and reducing their vulnerability to breakage will be described. In accordance with the present invention, individual connectors are strengthened or made more durable by distributing the side load or stress applied to an individual connector over all of the connectors in a group of connectors such as a group of F connectors extending from a television or an antenna switch. Turning to FIGS. 1A and 1B, a side and partial rear view of a typical television 10 is shown. As depicted, the television 10 includes an enclosure 12 and a recess in the enclosure 13 from which a plurality of antenna connectors 20A, 20B and 20C extend. An antenna connector cover plate 15 is typically placed over the connectors 20A, 20B and 20C. The cover plate 15 typically includes a thickened area 14 through which the connectors 20A, 20B and 20C, preferably F-Type connectors extend.

Figure 2:
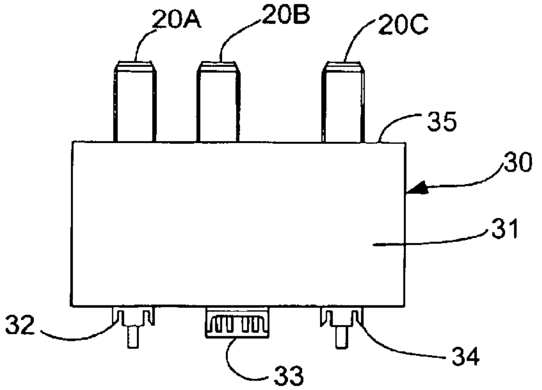
FIG. 2 is a top view of a typical antenna switch.
Figure 4:
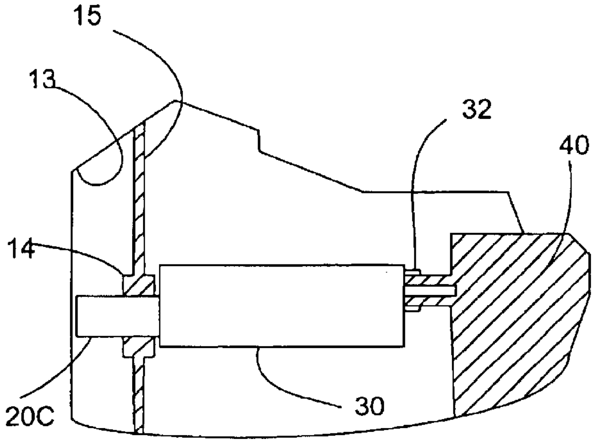
FIG. 4 is a partial side sectional view of a television set showing an antenna switch of FIG. 3 mounted therein with its connectors extending out of the television enclosure.

Instead of hardwiring the connectors 20A, 20B and 20C to the internal components of the television 10, television manufacturers typically employ an antenna switch 30 shown in FIG. 2. As depicted, a typical antenna switch 30 comprises a body 31 formed from a sheet metal stamping enclosure and housing the internal connections and electrical components of the switch 30. The F-type connectors 20A, 20B and 20C, which extend from the external connector end 35 of the body 31, are coupled to the internal plugs 32 and 34 through the internal connections of the switch 30. The switch 30 also typical includes a 4P connector extending in the same direction as the internal plugs 32 and 34. As shown in FIG. 4, the switch 30 is positioned within the television enclosure 12 such that the connectors (see 20C) extend out of the enclosure 12 through the thickened region 14 of the cover plate 15 and the internal plugs (see 32) are coupled to the internal components 40 of the television 10.

Figure 3:
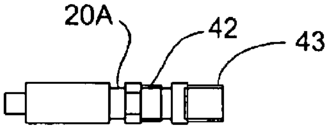
FIG. 3 is a plan view of a connector and adaptor assembly.

As shown in FIG. 3, a coaxial connector 42 of a coaxial cable 43 is typically used to connect an antenna or some other input or output device to the F-Type connectors 20A. As depicted, the F-type connectors 20A, 20B and 20C are long, typically about 17 millimeters, and narrow, and tend to be quite vulnerable to damage due to lateral stress applied to the connector. Such side stress typically occurs when the cable 43 is pulled, such as when the television 10 is pulled away from a wall from which the coaxial cable 43 is extending, often breaking the electrical connection between the connector 20A, 20B and 20C and the television 10 or the main body 31 of the antenna switch 30.

Figure 5:
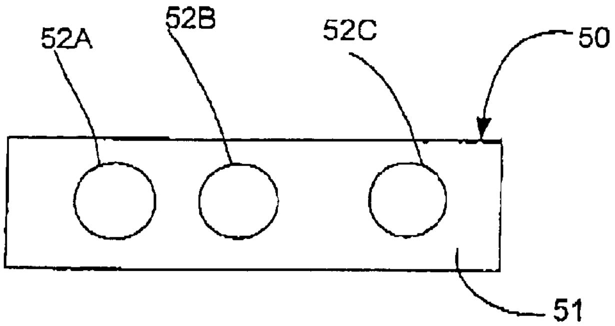
FIG. 5 is a plan view of a load distributing member or bracket of the present invention.
Figure 6:
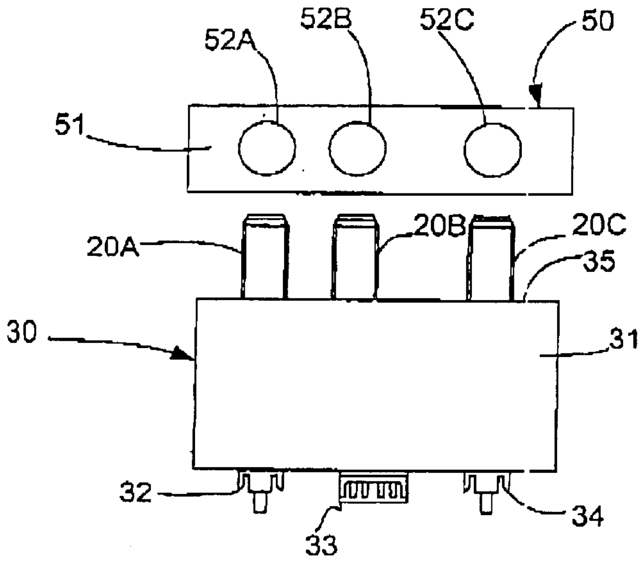
FIG. 6 is a plan view of the load distributing member or bracket of the present invention and top view of an antenna switch showing the alignment of the antenna switch connectors with the holes of the bracket.
Figure 7:
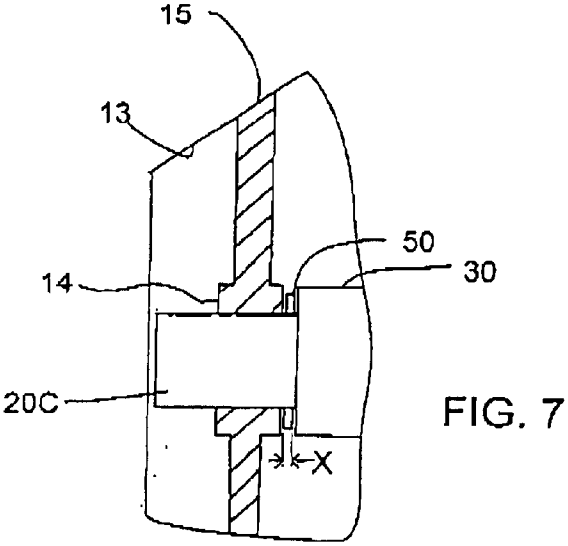
FIG. 7 is the partial side sectional view of a television set shown in FIG. 4 with a load distributing member or bracket mounted over the connector.

To strengthen these connectors 20A, 20B and 20C and, thus, reduce their vulnerability to lateral or side stress applied to the connectors 20A, 20B and 20C, a load distributing member or bracket 50 of the present invention is provided. In a preferred embodiment as depicted in FIG. 5, the load distributing member or bracket 50 comprises an elongate body 51 with a plurality of holes 52A, 52B and 52C formed in and extending through the body 51. The body 51 is preferably formed from a thin piece of cold rolled steel preferably having a thickness X (see FIG. 7) of about 1.0 millimeters and preferably in a range of about 0.5 millimeters to 3.0 millimeters, and preferably having a length and width of about 85 millimeters and 15 millimeters, respectively. The holes 52A, 52B and 52C, which are spaced apart in a desired pattern that matches the group of connectors 20A, 20B and 20C to be supported or strengthened (see FIG. 6), are sized to have a diameter slightly largely than the diameters of the connectors 20A, 20B and 20C to enable the load distributing member or bracket 50 to slide over the connectors 20A, 20B and 20C and, in the case of a switch 30, to abut the connector end 35 of the antenna switch body 31. As shown in FIG. 7, the bracket 50 is held in place axially and, preferably, held in place against the connector end 35 of the antenna switch 30, by the antenna connector cover plate 15 of the television enclosure 12. With the bracket 50 in place, individual connectors are strengthened or made more durable by distributing the side load or stress applied to an individual connector over all of the connectors in the group.

In operation, the connectors 20A, 20B and 20C such as F connectors and the like are connected to the internal components 40 of the television 10 or other consumer electronic device and mounted such that the connectors 20A, 20B and 20C extend out of the enclosure 12 of the television 10 or other consumer electronic devise. In the case of an antenna switch 30, the switch 30 is connected to the internal components 40 of the television 10 or other consumer electronic device and mounted such that its F connectors 20A, 20B and 20C extend out of the enclosure 12 of the television 10 or other consumer electronic device. The load distributing member or bracket 50 is then slid over the connectors 20A, 20B and 20C and held in place axially relative to the connectors 20A, 20B and 20C by the antenna connector cover plate 15. When a lateral load is applied to one of the connectors in a group of connectors 20A, 20B and 20C supported by the bracket 50, the load is distributed to all of the connectors 20A, 20B and 20C through the bracket. More particularly, the bracket 50 tends to move laterally in the direction of the load and, thus, distribute the load to all of the connectors 20A, 20B and 20C. The likelihood that such a load will result in breakage of or damage to the connector and/or its electrical connection to the internal components of the television or antenna switch tends to be greatly reduced when the bracket 50 of the present invention is employed.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A antenna switch comprising a body having a first end, a plurality of connectors extending from the first end of the body, and a load distributing member positionable around and operably coupled to each of the plurality of connectors and adapted to distribute a lateral load applied to one of the plurality of connectors to all of the plurality of connectors.

2. The device of claim 1, wherein the plurality of connectors are F-type connectors.

3. The device of claim 1, wherein the load distributing member comprises an elongate body with a plurality of holes formed therein.

4. The device of claim 3, wherein each of the plurality of holes corresponds to one of the plurality of connectors, wherein each of the plurality of holes are in spaced relation to one another and matching the spaced relation of the corresponding plurality of connectors.

5. The device of claim 4, wherein the diameter of each of the plurality of holes is slightly larger than the diameter of the corresponding one of the plurality of connectors.

6. The device of claim 3, wherein the body is about 1 millimeter thick.

7. The device of claim 3, wherein the thickness of the body is in a range of about 0.5 to 3 millimeters thick.

8. The device of claim 3, wherein the body is formed from cold rolled steel.

* * * * *